United States Patent
Lee

(10) Patent No.: US 8,076,987 B2
(45) Date of Patent: Dec. 13, 2011

(54) PULSE WIDTH MODULATING CIRCUIT

(75) Inventor: Chien-Min Lee, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 23 days.

(21) Appl. No.: 12/842,138

(22) Filed: Jul. 23, 2010

(65) Prior Publication Data

US 2011/0260804 A1    Oct. 27, 2011

(30) Foreign Application Priority Data

Apr. 21, 2010    (TW) .............................. 99112557 A

(51) Int. Cl.
*H03K 7/00* (2006.01)
*H03K 7/08* (2006.01)

(52) U.S. Cl. ...................................... 332/109; 332/107

(58) Field of Classification Search .......... 332/106–111; 327/172–177; 363/21.1, 21.11, 21.18, 26, 363/41, 42; 375/238
See application file for complete search history.

(56) References Cited

U.S. PATENT DOCUMENTS 6,384,817 B1 *   5/2002   Janssen et al. ................ 345/204

* cited by examiner

*Primary Examiner* — David Mis
(74) *Attorney, Agent, or Firm* — Altis Law Group, Inc.

(57) ABSTRACT

A pulse width modulating (PWM) circuit includes an activating module and a pulse generating module connected to the activating module. The activating module includes a current resource and a compensation unit. The current source generates an activating current, and the compensating unit detects the activating current and compensates the activating current if the activating current changes. The activating current is input to the pulse generating module to generate pulse voltages output by the pulse generating module.

8 Claims, 4 Drawing Sheets

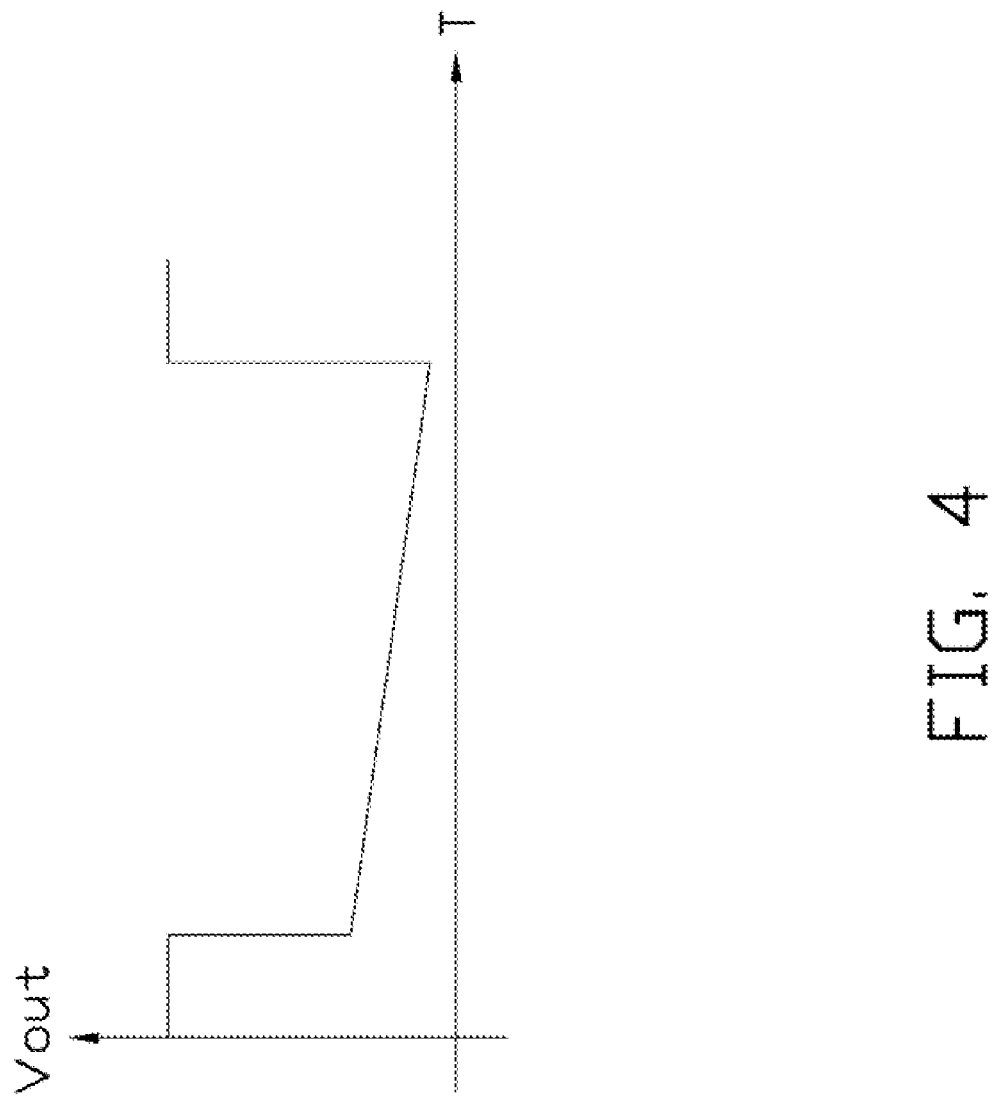

PULSE WIDTH MODULATING CIRCUIT

BACKGROUND

1. Technical Field

The present disclosure relates to pulse width modulating (PWM) circuits, and particularly to a PWM circuit with a compensation unit.

2. Description of Related Art

Pulse width modulating (PWM) circuits generally include inductors and capacitors. In use, the inductors and the capacitors cooperatively form oscillator circuits. When activating currents are input to the oscillator circuits, pulse voltages are correspondingly generated in the oscillator circuits and output. Relevant parameters, such as peak values, widths, and periods of the pulse voltages can be determined by predetermining the inductances of the inductors and the capacitances of the capacitors. However, if the activating currents input to the oscillator circuits change quickly (e.g., at the moment of turning on/off the current sources for providing the activating currents), the inductances of the inductors may be changed. Thus, the parameters of the pulse voltages generated by the oscillator circuits may be correspondingly changed, which may adversely affect the quality of the pulse voltages and damage the PWM circuits.

Therefore, there is room for improvement within the art.

BRIEF DESCRIPTION OF THE DRAWINGS

Many aspects of the present pulse width modulating (PWM) circuit can be better understood with reference to the following drawings. The components in the various drawings are not necessarily drawn to scale, the emphasis instead being placed upon clearly illustrating the principles of the present PWM circuit. Moreover, in the drawings, like reference numerals designate corresponding parts throughout the figures.

FIG. 4 is another wave curve of a pulse voltage output by the PWM circuit shown in FIG. 1, without using the compensation unit of the PWM circuit.

DETAILED DESCRIPTION

Figure 1:
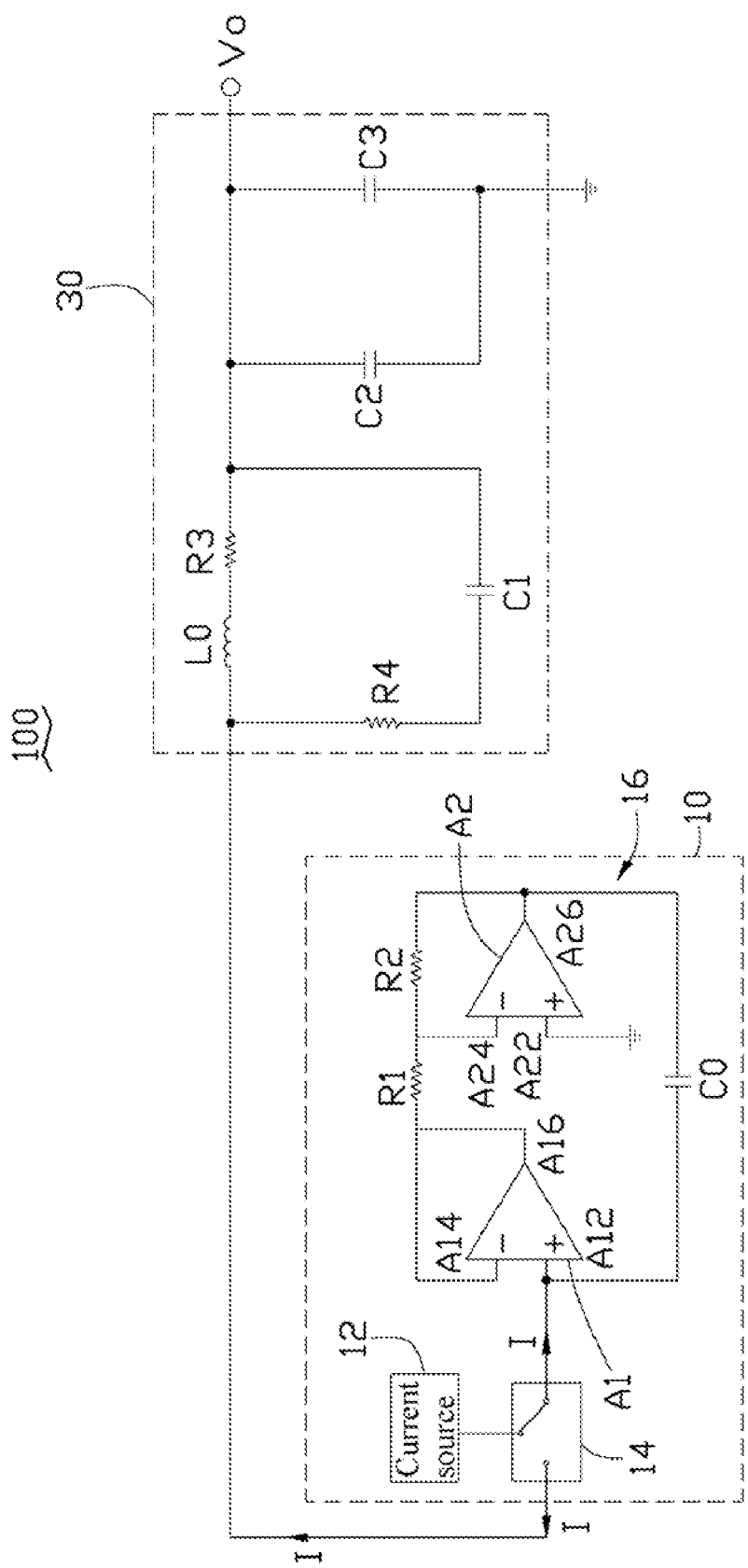
FIG. 1 is a circuit diagram of a PWM circuit, according to an exemplary embodiment.

FIG. 1 shows a pulse width modulating (PWM) circuit 100, according to an exemplary embodiment. The PWM circuit 100 includes an activating module 10 and a pulse generating module 30. The pulse generating module 30 is electrically connected to the activating module 10. When the activating module 10 generates activating currents input to the pulse generating module 30, the pulse generating module 30 correspondingly generates pulse voltages having predetermined parameters, such as peak values, widths, and periods, etc.

The activating module 10 includes a current source 12, a switch 14, and a compensation unit 16. The current source 12, the compensation unit 16, and the pulse generating module 30 are all connected to the switch 14. The switch 14 has two electric connection statuses. In an activating status, the switch 14 connects the current source 12 with the pulse generating module 30. In a regulating status, the switch 14 connects the current source 12 with the compensation unit 16.

The compensation unit 16 includes a first amplifier A1, a second amplifier A2, a first resistor R1, a second resistor R2, and a capacitor compensation controller C0. The first amplifier A1 is a non-inverting amplifier and includes a non-inverting input connector A12, an inverting input connector A14, and an output connector A16. The second amplifier A2 is an inverting amplifier and includes a non-inverting input connector A22, an inverting input connector A24, and an output connector A26. The non-inverting input connector A12 is connected to the switch 14. The inverting input connector A14 is connected to the output connector A16. The first resistor R1 has one end connected to the output connector A16 and another end connected to the inverting input connector A24. The second resistor R2 has one end connected to the inverting input connector A24 and another end connected to the output connector A26. The non-inverting input connector A22 is grounded. The capacitor compensation controller C0 has one pole connected to the non-inverting input connector A12 and another pole connected to the output connector A26.

The pulse generating module 30 includes an inductor L0, a third resistor R3, a fourth resistor R4, a first capacitor C1, a second capacitor C2, a third capacitor C3, and a pulse output connector Vo. The third resistor R3 has one end connected to one end of the inductor L0 and another end connected to one pole of the first capacitor C1, and the fourth resistor R4 has one end connected to another end of the inductor L0 and another end connected to another pole of the first capacitor C1. Each of the second capacitor C2 and the third capacitor C3 has one pole connected to the end of the third resistor R3 that is connected to the first capacitor C1 and another pole grounded. Thus, the inductor L0, the first capacitor C1, the third resistor R3, and the fourth resistor R4 cooperatively form an oscillator circuit (not labeled). The pulse output connector Vo is also connected to the end of the third resistor R3 that is connected to the first capacitor C1. The switch 14 is connected to the end of the inductor L0 that is connected to the fourth resistor R4.

In use, the current source 12 generates an activating current I. The switch 14 is switched between the activating status and the regulating status back and forth in a predetermined frequency f, i.e., alternately connecting the current source 12 to the pulse generating module 30 and the compensation unit 16 in the frequency f. When the current resource 12 is connected to the pulse generating module 30, the activating current I is input to the pulse generating module 30 and generates pulse voltages in the oscillator circuit formed by the inductor L0, the first capacitor C1, the third resistor R3, and the fourth resistor R4. The pulse voltages are output through the pulse output connector Vo, and the second capacitor C2 and the third capacitor C3 can filter alternating portions mixed in the pulse voltages before the pulse voltages are output.

When the current resource 12 is connected to the compensation unit 16, the current I is input to the capacitor compensation controller C0 through the first amplifier A1 and the second amplifier A2. Thus, the capacitor compensation controller C0 detects the activating current I in the predetermined frequency f of switching the switch 14 between the two electric connection statuses. If the activating current I changes, the capacitor compensation controller C0 regulates the capacitance Cc thereof to regulate the change of the activating current I, such that the activating current I is kept unchanged when it is input to the pulse generating module 30.

Particularly, in Laplace domain, the impedance of the capacitor compensation controller C0 is represented as 1/SCc. If V represents the voltage on the non-inverting input connector A12, $V_A$ represents the voltage on the output connector A26, $R_1$ represents the impedance of the first resistor R1, and $R_2$ represents the impedance of the second resistor R2, it can be inferred that:

$$V_A = -\frac{R_2}{R_1}V, \quad V - V_A = \frac{I}{SC_C}, \quad \text{and} \quad I = C_C SV\left(1 + \frac{R_2}{R_1}\right).$$

Figure 2:
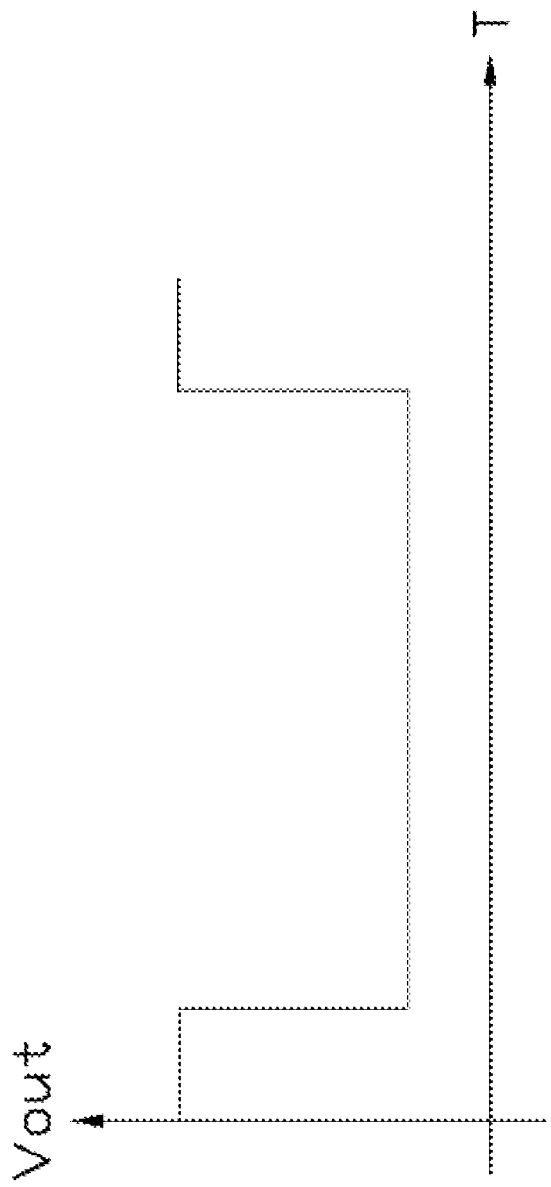
FIG. 2 is a wave curve of a pulse voltage output by the PWM circuit shown in FIG. 1, using the compensation unit of the PWM circuit.

Therefore, the current I can be regulated by regulating the capacitance Cc of the capacitor compensation controller C0. Referring to FIG. 2, when the activating current I is detected and kept unchanged by the compensation unit 16, the pulse generating module 30 activated by the current I can generate even pulse voltages output from the pulse output connector Vo.

On the contrary, if the compensation unit 16 is not used, the pulse voltages generated by the pulse generating module 30 may be adversely affected when the current I changes. Particularly, if ΔI represents the change of the activating current I, Vc represents the voltage on the first capacitor C1, $C_1$ represents the capacitance of the first capacitor C1, Vout represents the voltage on the pulse output connector Vo, $I_L$ represents the current passing through the inductor L0, $V_L$ represents the voltage on the inductor L0 and the third resistor R3, L represents the inductance of the inductor L0, $R_3$ represents the impedance of the third resistor R3, and $R_4$ represents the impedance of the fourth resistor R4, it can be inferred that:

$$L = \frac{(V - Vout)f}{\Delta I}, \text{ and}$$

$$V_C = V_L \times \frac{\frac{1}{SC_1}}{R_4 + \frac{1}{SC_1}}$$

$$= I_L(SL + R_3) \times \frac{1}{SC_1 R_4 + 1}$$

$$= I_L \times R_3 \times \frac{\frac{SL}{R_3} + 1}{SC_1 R_4 + 1}.$$

Figure 3:
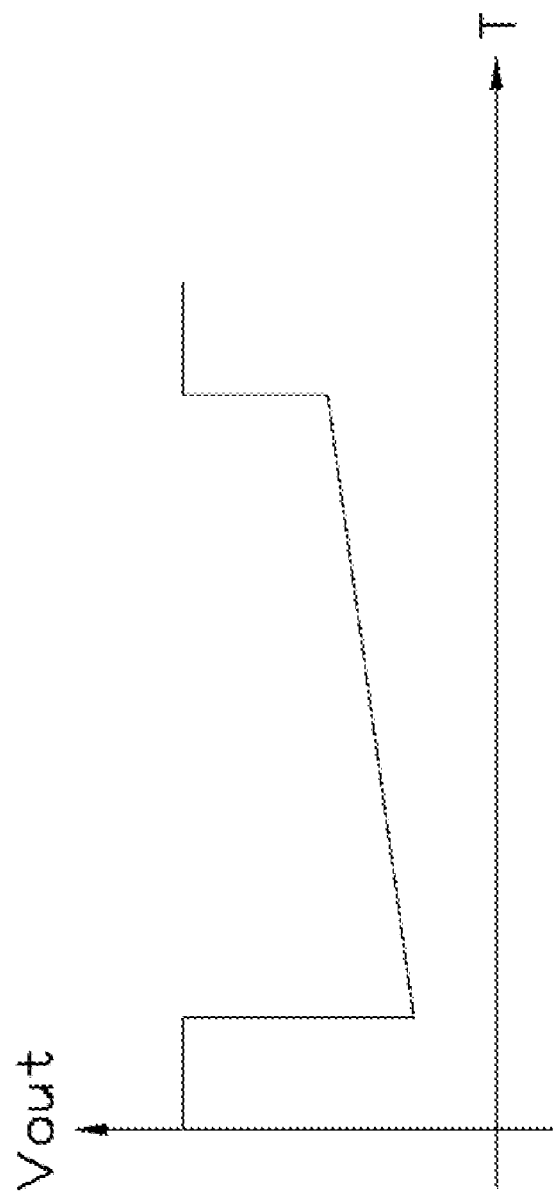
FIG. 3 is a wave curve of an pulse voltage output by the PWM circuit shown in FIG. 1, without using the compensation unit of the PWM circuit.

Therefore, the change of the activating current I (i.e., ΔI) can generate change of Vc when the compensation unit 16 is not used. According to principle of oscillator circuits, change of Vc can further generate change of Vout, which may adversely affect the quality of the pulse voltages output by the PWM circuit 100. Referring to FIG. 3 and FIG. 4, as known in experiments, without using the compensation unit 16, the pulse output connector Vo of the PWM circuit 100 outputs pulses as shown in FIG. 3 when the activating current I decreases, and outputs pulses as shown in FIG. 4 when the activating current I increases.

The present PWM circuit 100 uses the compensation unit 16 to regulate the capacitance Cc of the capacitor compensation controller C0 when the activating current I changes, thereby compensating the change of the activating current I, such that the activating current I is kept unchanged when it is input to the pulse generating module 30. In this way, despite the activating current I changing in use of the PWM circuit 100, the PWM circuit 100 can output even pulse voltages.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A pulse width modulating (PWM) circuit, comprising:
an activating module including a current resource and a compensating unit; the current source generating an activating current, and the compensation unit detecting the activating current and compensating the activating current if the activating current changes; and
a pulse generating module connected to the activating module, the activating current input to the pulse generating module to generate pulse voltages output by the pulse generating module.

2. The PWM circuit as claimed in claim 1, wherein the activating module further includes a switch, the current resource, the compensating unit, and the pulse generating module all connected to the switch, the switch alternately connecting the compensating unit and the pulse generating module to the current source in a predetermined frequency.

3. The PWM circuit as claimed in claim 2, wherein when the current resource is connected to the pulse generating module, the activating current is input to the pulse generating module and generates pulse voltages; when the current source is connected to the compensation unit, the compensation unit detects the activating current and compensates the activating current if the activating current changes.

4. The PWM circuit as claimed in claim 3, wherein the compensation unit includes a capacitor compensation controller, during the current source being connected to the compensation unit, the capacitor controller detects the activating current, and regulates the capacitance thereof to regulate the activating current when the activating current I changes.

5. The PWM circuit as claimed in claim 4, wherein the compensation unit further includes a first amplifier, a second amplifier, a first resistor, and a second resistor; each of the first amplifier and the second amplifier including a non-inverting input connector, an inverting input connector, and an output connector; the non-inverting input connector of the first amplifier connected to the switch, the inverting input connector of the first amplifier connected to the output connector of the first amplifier, the first resistor having one end connected to the output connector of the first amplifier and another end connected to the inverting input connector of the second amplifier, the second resistor having one end connected to the inverting input connector of the second amplifier and another end connected to the output connector of the second amplifier, the non-inverting input connector of the second amplifier grounded, the capacitor compensation controller having one pole connected to the non-inverting input connector of the first amplifier and another pole connected to the output connector of the second amplifier.

6. The PWM circuit as claimed in claim 5, wherein the first amplifier is a non-inverting amplifier, and the second amplifier is an inverting amplifier.

7. The PWM circuit as claimed in claim 3, wherein the pulse generating module includes an inductor, a third resistor, a fourth resistor, and a first capacitor; the third resistor having one end connected to one end of the inductor and another end connected to one pole of the first capacitor, and the fourth resistor having one end connected to another end of the inductor and another end connected to another pole of the first capacitor; the switch connected to the end of the inductor that is connected to the fourth resistor.

8. The PWM circuit as claimed in claim 7, wherein the pulse generating module further includes a second capacitor, a third capacitor, and a pulse output connector; each of the second capacitor and the third capacitor having one pole connected to an end of the third resistor that is connected to the first capacitor and another pole grounded; the pulse output connector connected to the end of the third resistor that is connected to the first capacitor, pulse voltages generated by the PWM circuit output by the pulse output connector.

* * * * *